United States Patent [19]

Hammann, IV et al.

[11] Patent Number: 4,971,885
[45] Date of Patent: Nov. 20, 1990

[54] MICROCAPSULE COATING COMPOSITIONS CONTAINING COUPLING AGENTS FOR IMPROVED ADHESION

[75] Inventors: William A. Hammann, IV; Rong-Chang Liang, both of Centerville; Teresa M. Thomas, Springfield; Jesse Hipps, Sr., Miamisburg, all of Ohio

[73] Assignee: The Mead Corporation, Dayton, Ohio

[21] Appl. No.: 347,560

[22] Filed: May 4, 1989

[51] Int. Cl.$^5$ ................................................ G03C 1/72
[52] U.S. Cl. ..................................... 430/138; 430/275; 430/278; 430/524; 430/525; 430/526; 430/631; 430/954

[58] Field of Search .............. 430/138, 275, 278, 524, 430/525, 526, 631, 954

[56] References Cited

U.S. PATENT DOCUMENTS 4,755,445 7/1988 Hasegawa .......................... 430/138

Primary Examiner—Hoa Van Le
Attorney, Agent, or Firm—Thompson, Hine and Flory

[57] ABSTRACT

A recording sheet which comprises a substrate having a large of a metal on the surface thereof, and a layer of microcapsules, said layer of microcapsules including a coupling agent to improve the adhesion of said microcapsule layer to said metal layer; the coupling agent is preferably a silane.

9 Claims, No Drawings

MICROCAPSULE COATING COMPOSITIONS CONTAINING COUPLING AGENTS FOR IMPROVED ADHESION

BACKGROUND OF THE INVENTION

1. FIELD OF INVENTION

The present invention relates to a recording sheet having a surface layer of microcapsules and more particularly to an imaging sheet employing a layer of photosensitive microcapsules wherein improved adhesion of the microcapsules to the substrate is provided through the use of coupling agents.

2. DESCRIPTION OF PRIOR ART

Imaging systems employing photosensitive microcapsules are described in U.S. Pat. Nos. 4,399,209 and 4,440,846 to The Mead Corporation. While the adhesion problems addressed herein have arisen in transfer imaging systems of the type described in U.S. Pat. No. 4,399,209, the modifications which are proposed are also applicable to the self-contained imaging systems of U.S. Pat. No. 4,440,846. Transfer systems, utilize a photosensitive sheet known as a donor sheet which is prepared by coating a layer of photohardenable microcapsules on a support. The donor sheet is image-wise exposed to actinic radiation, assembled with a developer sheet and passed through the nip between a pair of pressure rollers. Images are formed by exposure-controlled release of an image-forming agent contained with a photohardenable composition in the microcapsules. The image-forming agent is typically a substantially colorless color precursor which reacts with a developer to form a visible image.

A need has arisen for improved adhesion of the microcapsules to the substrate. A number of factors have contributed to this need. First, some of the binders which have previously been used, like polyvinyl alcohol (PVA), do not provide good adhesion under higher humidity conditions, e.g. 25° C., 85% RH. It has also been found that higher pressures and slower roller speeds may be desirable in rupturing microcapsules—this increases the tendency for the microcapsules to adhere to the developer sheet as the microcapsules traverse the pressure roll and causes delamination of the microcapsules when the donor sheet and the developer sheet are separated.

The microcapsules are also preferably coated on highly reflective metallic substrates which may have low adhesion for the microcapsules. A particularly preferred reflective substrate is a material such as an aluminized film. These films are extremely hydrophilic and do not bind a layer of microcapsules well especially under humid conditions.

Finally, in some processes, the donor sheet may be reversed and rewound between exposures to eliminate waste between successive images. As a result, some portions of the donor sheet may traverse the pressure rollers as many as three times, thus further accentuating the need for better adhesion the microcapsules.

The delamination problem is exacerbated in that the developer materials which are typically used are low molecular weight phenolic resins which are somewhat tacky. When the microcapsule sheet is exposed and assembled with the developer sheet coated with a phenolic resin to form the image, the microcapsules can be picked off the substrate.

Attempts have been made to address microcapsule delamination in the prior art. Japanese KOKAI 62-176893 to Canon teaches a transfer recording medium comprised of a substrate and microcapsules disposed thereon, with the microcapsules or their coatings fixed to a surface material by means of a chemical reaction.

In the Canon disclosure, microcapsules are disposed on a polyethylene terephthalate film which is integrated with the wall material of the microcapsules by thermal polymerization, photopolymerization, condensation polymerization, crosslinking or the like. A substance which effects thermal polymerization or photopolymerization is included in the microcapsule walls and substrate or a surface coating and may include a thermal polymerization or photopolymerization initiator, a polymeric prepolymer, a polymeric oligomer and a crosslinking agent such as ethylene glycol diacrylate, propylene glycol diacrylate or 4-butanediol diacrylate.

Summary of the Invention

The present invention is useful in overcoming microcapsule delamination in carbonless paper, heat-sensitive recording paper, and the like, but it is particularly directed to providing improved photosensitive materials of the type described in U.S. Pat. Nos. 4,399,209 4,440,846, 4,772,530 and 4,772,541 having improved adhesion of the microcapsules. This objective is accomplished through the use of a coupling agent.

In the aforementioned photosensitive materials, the microcapsules are often provided on a metallized support such as aluminized polyethylene terephthalate (ALPET). One reason that microcapsules exhibit poor adhesion to aluminized surfaces is that the aluminum oxidizes and forms a thin layer of aluminum oxide. This aluminum oxide layer is very hygroscopic and readily bonds a layer of water molecules when exposed to the air. This layer of water molecules prevents one from obtaining good adhesion of a coating, such as a coating of microcapsules, to the aluminized surface (while the discussion herein will refer to aluminum surfaces, similar or related problems occur in attempting to bond microcapsules to other metal surfaces).

It has been found that the adhesive strength of the microcapsules to aluminized and other metal surfaces is improved through the use of a coating system containing an additive that has the ability to displace the water molecules bonded to the aluminized surface and which has a strong affinity for the microcapsules or the binder in which they are contained. This additive links the microcapsule layer and the aluminum oxide and thereby improves adhesion of the microcapsule layer to the aluminized surface. This additive is hereafter referred to as a "coupling agent". Particularly useful coupling agents for water-based coatings are silanes and titanium, zirconium and chromium coupling agents.

In accordance with the present invention, a recording sheet is provided which comprises a substrate having a layer of a metal on the surface thereof, and a layer of microcapsules, the layer of microcapsules containing a coupling agent having at least one moiety which ionically or covalently bonds to the metal and another moiety which is compatible with or exhibits an affinity for the binder and/or the wall material forming the microcapsule, to anchor the microcapsule layer to the metal layer and to improve adhesion.

In a preferred embodiment, the recording sheet is AlPET, and the coupling agent is an organomethoxysilane.

DETAILED DESCRIPTION

As previously discussed, the present invention is particularly directed to providing improved photosensitive materials of the type described in U.S. Pat. Nos. 4,399,209; 4,440,846; 4,772,530 and 4,772,541 having improved adhesion of the microcapsule layer to a metallic substrate, and more particularly AlPET. Other metal substrates useful in the present invention include tin and copper foils and coated films. This objective is accomplished through the use of a coupling agent.

The adhesive strength of the microcapsules to the aluminized surface is improved through the use of a coating system containing a coupling agent that has the ability to displace the water molecules bonded to the aluminized surface and which has a strong affinity for the microcapsule's reactive moieties. Thus, the additive bonds itself to both the microcapsule layer and the aluminum oxide layer linking the two layers and improving adhesion of the microcapsule layer to the aluminized surface. Alternatively coupling agents can be pre-coated on the substrate and overcoated with a layer of microcapsules.

Preferred coupling agents are polysiloxanes having the general formula (I):

$$R'-Si-(OR)_3 \qquad (I)$$

where R' is a moiety which exhibits strong affinity for the microcapsule layer such as a long chain alkyl group having 3 to 18 carbon atoms and additionally having functional groups selected from the group consisting of amino, hydroxyl, epoxidyl and acryloyl groups; or a polyphenol group having 1 to 10 phenolic moieties; and where R is generally methyl or other short chain (C1–C6) alkyl groups.

R' is preferably an alkyl group have 3 to 6 carbon atoms with the above-mentioned functional group at the omega-position or a polyphenol such as low molecular weight (less than 10,000) novolac, an epoxidized novolac, a low molecular weight (less than 10,000) melamine formaldehyde resin or an alkoxy (e.g. propoxy-ethoxy) phenolic resin.

Another benefit of the siloxane is that not only does it displace water and anchor the microcapsule layer, but the silicon atoms bond with multiple aluminum atoms to create a stable surface configuration resistant to attack by moisture Additionally, after complete substitution has taken place, no aluminum oxide sites remain available for formation of the undesirable water film.

In addition to silanes, other coupling agents include titanium couplers, chromium couplers and zirconium couplers such as zirconium [tetrakis(salicylidene)diamiobenzidi] complexes; zirconium (iv) 2,2-bis(2-propenolatomethyl) butanolato cyclodi-2,2-bis 2-propenolatomethyl) butanolato pyrophasphato-0,0; tetraalkoxy titanates (e.g., tetraisopropyl titanate); dialkoxydiorganofunctional titanates; monoalkoxytriorganofunctional titanates (titanium (iv) 2-propanolato tris(dioctyl)pyrophosphato-0; titanium (iv) 2-propanolatotris(3,6-diata)hexanolato; titanium(iv) 2-propanolato tris-isooctadecanato-0, etc. may be used. Complexes such as this are very bulky and do not allow water to form a layer on the aluminized surface, although they may not form real covalent bonds with the surface as silanes will.

The coupling agents may be used alone or in combination with a binder such as polyvinyl alcohol or polyvinyl pyrrolidone. The coupling agent is preferably present in an amount of about 0.1 to 10 parts by weight per 100 parts of microcapsules. They may be used as a primer coating in a double layer coating process or used as an additive in a single layer coating. In the former case less coupling agent is needed but the coating process is more complicated.

Thus, in summary, cohesion of the microcapsule layer can also be improved through the use of a crosslinking agent which forms crosslinks or chemical bonds with reactive moieties in the binder(s) or the surface of the microcapsules thereby linking the microcapsules together and improving cohesion. The principal sources of these reactive moieties are the materials which form the microcapsule walls (the wall formers), the emulsifiers and protective colloids used in making the microcapsules which become bonded to or entrained in the microcapsules walls and binders, if present.

Microcapsules useful in the present invention can be prepared by any of a number of conventional processes. They may be gelatin microcapsules, polyurea microcapsules, polyurethane microcapsules, urea-formaldehyde microcapsules, melamine-formaldehyde microcapsules, etc. The preferred microcapsules are melamine-formaldehyde microcapsules prepared using a combination of pectin and polystyrene sulfonate as an emulsifier. This method is described in U.S. Application Ser. No. 128,292 filed December 3, 1987 which is incorporated herein by reference. Also useful are microcapsules prepared using pectin and isobutylene maleic anhydride copolymer as emulsifiers as described in U.S. Pat. No. 4,608,330.

Examples of reactive ("crosslinkable") moieties that may be found in the microcapsule walls include hydroxyl groups, sulfonate groups, amino groups and carboxyl groups. Hydroxyl groups may be introduced to the microcapsule though the use of emulsifiers such as pectin, gum arabic, PVA, or they are inherently present in microcapsules prepared from hydroxypropyl cellulose (hereinafter HPC) as described in U.S. Pat. No. 4,025,455.

Sulfonate groups may be introduced to the microcapsules through the use of emulsifiers such as sulfonated polystyrene (Versa from National Starch Co.), polyvinyl sulfonate, sodium or potassium sulfopropyl (meth)acrylate copolymers.

Carboxyl groups may be introduced through the use of emulsifiers or protective colloids such as pectin, gum arabic, casein, carboxymethylcellulose (hereinafter CMC), methacrylic and acrylic acid copolymers, or maleic anhydride copolymers such as styrene maleic anhydride copolymer and isobutylene maleic anhydride copolymer.

Amino groups are present in microcapsules prepared using casein and in certain polyurea microcapsules prepared by interfacial polymerization of a polyisocyanate and a polyamine.

Crosslinking of microcapsules is achieved by reacting the reactive moieties discussed above with a crosslinking or bridging agent. The crosslinking agent may form ionic or covalent bonds with the microcapsules or a binder containing them.

In accordance with the present invention the coupling agent and the crosslinker may react with any of the aforementioned moieties in the wall of the microcapsule or in a binder in which the microcapsules are contained. Examples of binders having reactive moieties include polyvinyl alcohol, polyamines, polyacrylamide, 2-hydroxyethyl acrylate copolymers and phenolic resins.

Any polyfunctional or polyvalent compound which is capable of interacting with the aforementioned moieties may be a useful crosslinking agent. Examples of useful crosslinking agents include polyvinylpyridine (PVPY), gelatin, sodium borax, zinc salts such as zinc chloride, chromium salts such as chromic acid, polyvinylbenzyl trimethylammonium chloride, melamine formaldehyde resins, and glyoxal. Borax, other metal borates, and metal salts readily form complexes between microcapsules containing hydroxyl groups in the wall, and also form crosslinks in binders containing hydroxyl, carboxyl and amino groups. Glyoxal will react with any of the reactive moieties discussed. PVPY forms crosslinks with carboxyl and sulfonate groups by the pH dependent reaction discussed next.

PVPY forms an ionic complex or ionomer with microcapsules containing carboxyl groups or sulfonate groups. In order to achieve crosslinking it is necessary to bring the coating composition to a pH at which the PVPY is essentially positively charged and the carboxyl or sulfonate groups are present as the free bases (e.g., COO- or SO-2. By the same token, crosslinking can be prevented (to permit the composition to be coated without prematurely setting) by maintaining the composition at a pH at which the PVPY is also negatively charged. Thus, to coat the microcapsules, a pH is selected which is greater than the isoelectric point of PVPY, such a pH may range from about 7.5 to 9.5; whereas to set the microcapsules a pH less than the isoelectric point of PVPY and greater than the isoelectric point of pectin or sulfonated polystyrene is used; such a pH may range from about 4.5 to 6.5.

In accordance with a preferred embodiment of the invention, the pH adjustments necessary to cause or prevent crosslinking are produced through the addition and evaporation of ammonia. In accordance with this embodiment of the invention, a microcapsule slurry is prepared. An acid such as phosphoric acid is added to lower the pH to approximately 4.5-6.5. The slurry is then treated with ammonia hydroxide to raise the pH to approximately 7.5-9.5 for coating. PVPY is added to the microcapsule slurry. At this point, under basic conditions, both the crosslinking agent and the reactive moieties of the microcapsules have a negative charge and no crosslinking occurs. The lack of crosslinking at this point permits the microcapsule slurry to maintain a fluid consistency which is easily coated onto the desired substrate.

After the microcapsule slurry has been coated onto the desired substrate, the ammonia is evaporated, and the coated microcapsule slurry enters the pH range in which the crosslinking agent exhibits a positive charge and the reactive moiety associated with the microcapsule exhibits a negative charge, and crosslinking occurs.

The crosslinker is generally employed in an amount of approximately 1 to 5% by weight, and preferably about 1 to 2% by weight solids based on the coating composition. As a general rule, good adhesion is achieved when the amount of crosslinker plus reactive moiety source (e.g., an emulsifier) is present in an amount of 2 to 4% by weight.

In a preferred embodiment, the crosslinking agent is polyvinyl pyridine, poly(2-N,N-dimethylaminoethyl (meth)acrylate) or their copolymers, the reactive moieties are sulfonate groups which are provided by a sulfonated polystyrene emulsifier which is present within or on the surface of the microcapsule walls, and the reaction of the crosslinking agent is a pH dependent reaction which is controlled to permit one to formulate a composition which is readily coated and the pH is adjusted to cause the microcapsules to bond to one another via the crosslinking agent after coating.

Methods for preparing microcapsules and photosensitive compositions preferred for use herein are described in U.S. Pat. No. 4,772,541. Preferred developers are described in U.S. Application Ser. No. 073,030 filed July 14, 1987 and preferred methods for making microcapsules with sulfonated polystyrene and pectin are described in U.S. Application Ser. No. 128,292 filed Dec. 3, 1987.

EXAMPLE 1

A slurry of microcapsules was prepared containing:

|  | % Dry Weight |
| --- | --- |
| Melamine-formaldehyde microcapsules | 94.8% |
| Triton X-100 (Rohm & Haas) | 1.2 |
| Dow Additive 25 (Dow Corning) | 4.0 |

Dow Additive 25 from Dow Chemical Corporation is an organomethoxysilane. The slurry was coated on ALPET at a coat weight (dry) of 6 g/cm$^2$ and dried at 150° C. It was found that the addition of the Dow 25 organomethoxysilane improved the adhesion of the microcapsules to the aluminized substrate at 35° C., 85% RH. The microcapsules remain adhered to the substrate when the substrate traverse the rolls at a feed rate of 5 mm/sec to 90 mm/sec, and at a development pressure of 350 to 700 PLI. The silane has multifunctional reactivity and promoted adhesion of the microcapsule layer to the aluminized substrate.

EXAMPLE 2

A comparison of a microcapsule slurry utilizing an organomethoxysilane and a slurry not utilizing an organomethoxysilane is provided.

A first slurry was formulated as follows:

| Formulation | % Dry Weight |
| --- | --- |
| Melamine-formaldehyde microcapsules | 95.8 |
| Triton x-100 | 1.2 |
| PVA 205 (polyvinyl alcohol) | 3.0 |

Coating conditions were 18% coating solids, 6–8g/m$^2$ coat weight, 150° C. dryer temperature.

A second slurry was formulated according to the following:

| Formulation | % Dry Weight |
| --- | --- |
| Melamine-formaldehyde microcapsules | 92.8 |
| Triton x-100 | 1.2 |
| Dow Additive 25 | 4.0 |
| PVA 205 | 2.0 |

Coating conditions were 18% coating solids, 6 g/m$^2$ coating weight, 150° C. dryer temperature.

As may be seen from the above formulations, in the second slurry, the typical PVA 205 binder was reduced from 3% to 2%, and 4% of the Dow 25 organomethoxysilane was added, with the result that the overall binder level was increased from 3% to 6%.

Improved adhesion performance was found to be the result. The first slurry failed adhesion performance at a test pressure of 350 pli, 35° C., 65% RH. The second slurry maintained adhesion at a test pressure of 626 pli, 35° C., 65% RH and at a second test pressure of 595 pli, 38° C., 85% RH, thus indicating that the presence of the organomethoxysilane improved adhesion of the microcapsule layer to the aluminized substrate.

Having described the invention in detail and by reference to preferred embodiments thereof, it will be apparent that modifications and variations are possible without departing from the scope of the invention defined in the appended claims.

What is claimed is:

1. A recording sheet which consisting essentially of a substrate having a layer of a metal on the surface thereof, and a layer of photosensitive microcapsules on the surface of said metal layer, said layer of microcapsules including a coupling agent to improve the adhesion of said microcapsule layer to said metal layer.

2. The recording sheet of claim 1, wherein said metal is aluminum.

3. The recording sheet of claim 1, wherein said coupling agent is a compound having at least one moiety which ionically or covalently bonds to said metal and another moiety which is compatible with said layer of microcapsules.

4. The recording sheet of claim 3, wherein said coupling agent is a silane.

5. The recording sheet of claim 4, wherein said silane is a compound of the general formula (I):

$$R' \, Si \, (OR)_3 \qquad (I)$$

where $R'$ is an alkyl group having 3 to 18 carbon atoms and additionally having functional groups selected from the group consisting of amino, hydroxyl, epoxidyl and acryloyl groups, or a polyphenol group having 1 to 10 phenolic moieties; and where $R$ is a short alkyl having 1 to 6 carbon atoms.

6. The recording sheet of claim 5, wherein said silane is an organomethoxy silane.

7. The recording sheet of claim 1, wherein said coupling agent is used in an amount of about 0.1 to 10 parts by weight per 100 parts microcapsules.

8. The recording sheet of claim 1 wherein said coupling agent is a titanium, ziconium or chromium coupling agent.

9. The recording sheet of claim 8 wherein said coupling agent is a titanium coupling agent.

* * * * *